United States Patent
Prinz

(10) Patent No.: US 7,889,542 B2
(45) Date of Patent: *Feb. 15, 2011

(54) METHOD OF ADDRESSING DIGITAL DATA

(75) Inventor: Gary Prinz, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/078,889

(22) Filed: Apr. 8, 2008

(65) Prior Publication Data

US 2008/0192533 A1    Aug. 14, 2008

Related U.S. Application Data

(62) Division of application No. 10/979,854, filed on Nov. 3, 2004, now Pat. No. 7,379,329.

(51) Int. Cl.
    *G11C 11/00*    (2006.01)

(52) U.S. Cl. .................................................... 365/158

(58) Field of Classification Search ................. 365/158, 365/32, 8
    See application file for complete search history.

(56) References Cited

U.S. PATENT DOCUMENTS

| | | | |
|---|---|---|---|
| 5,477,482 A * | 12/1995 | Prinz | 365/129 |
| 5,923,583 A * | 7/1999 | Womack | 365/171 |
| 6,391,483 B1 * | 5/2002 | Zhu et al. | 428/810 |
| 6,927,073 B2 * | 8/2005 | Huggins | 438/3 |
| 6,956,257 B2 * | 10/2005 | Zhu et al. | 257/295 |
| 2004/0240255 A1 * | 12/2004 | Smith et al. | 365/158 |
| 2004/0264239 A1 * | 12/2004 | Tsang | 365/158 |
| 2006/0028863 A1 * | 2/2006 | Chung et al. | 365/158 |

* cited by examiner

*Primary Examiner*—Hoai V Ho
*Assistant Examiner*—Anthan T Tran
(74) *Attorney, Agent, or Firm*—Amy L. Ressing; Stephen T. Hunnius

(57) ABSTRACT

A magnetic memory storage device with at least one magnetic storage element comprising electrical addressing leads to inject electrical current directly through a single magnetic memory storage element. The number of electrical addressing leads is at least one more than the number of magnetic memory storage elements.

7 Claims, 2 Drawing Sheets

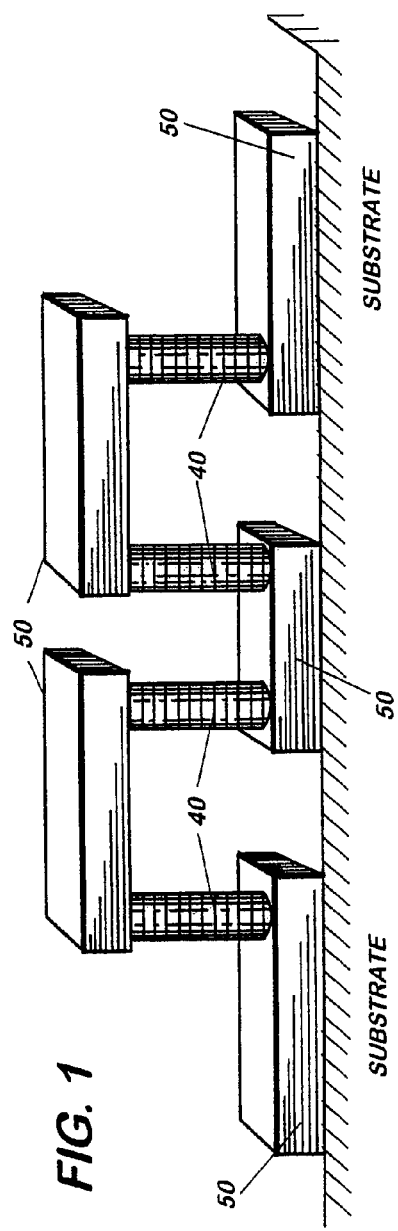
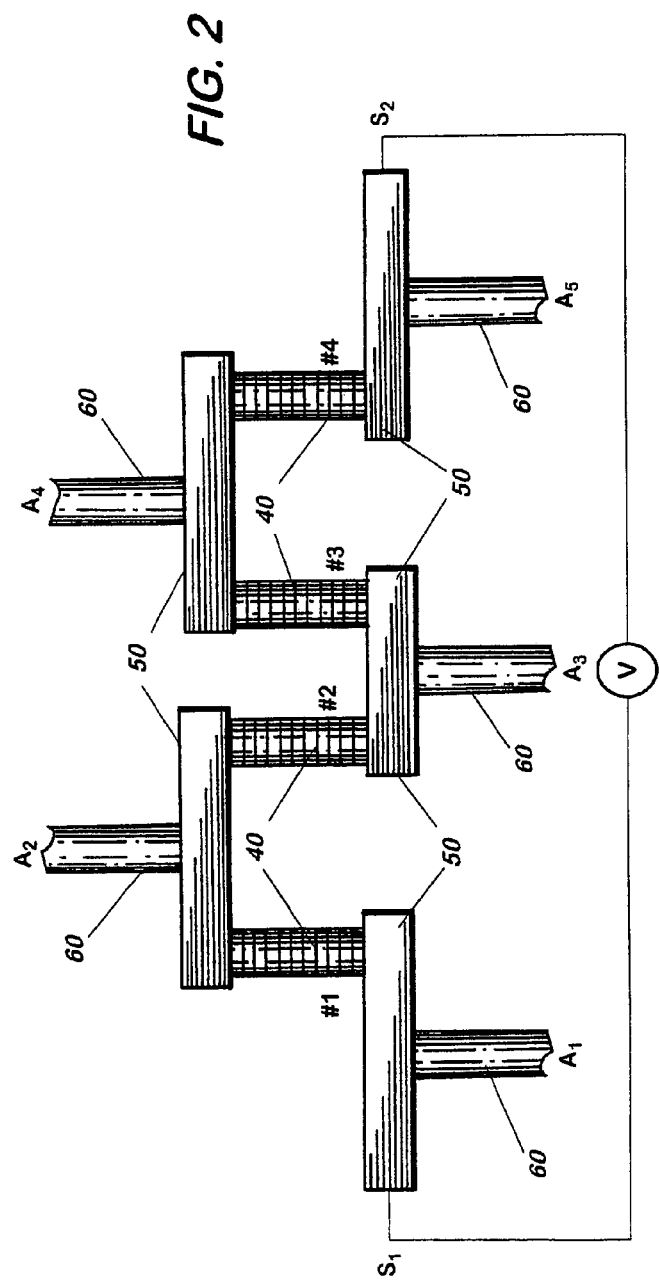

METHOD OF ADDRESSING DIGITAL DATA

This application is a divisional application, and claims priority, to U.S. patent application Ser. No. 10/979,854 now U.S. Pat. No. 7,379,329, filed on Nov. 3, 2004, herein incorporated by reference in its entirety.

BACKGROUND

1. Field of the Invention

The present invention relates to magnetic memory and, more specifically, to addressing architecture for perpendicular giant magnetoresistance memory.

2. Description of the Related Art

Constructing random access memory for computers from magnetic elements has the advantages of very high reliability, non-volatility in the event of power loss and infinite lifetime under use. It has been previously shown that magnetic information storage elements can be fabricated by exploiting giant magnetoresistance (GMR) multilayer materials in which the current is propagated perpendicular to the planes of the layers (CPP). See, e.g., U.S. Pat. No. 5,477,482 to Prinz, the entire contents of which are incorporated herein by reference. These elements can be formed into a series-resistance line as shown in FIG. 1. These lines are most easily fabricated by multiple depositions and lithographic patterning on an appropriate substrate.

Although the series-resistance line construction (sense lines) is useful for sensing the resistance of the memory storage elements (Bits), it lacks the means to address an individual Bit without some additional circuitry. Previously suggested approaches use additional electrically conducting elements located in the near-vicinity of each Bit to generate localized magnetic fields to alter the magnetic state of the nearest Bit without altering any other Bits. See, e.g., U.S. Pat. No. 6,391,483 to Zhu et al., the entire contents of which are incorporated herein by reference. These approaches are very demanding in their fabrication tolerances and are inefficient in their use of the expended electrical power to effect the magnetic state of the Bit.

SUMMARY

The aforementioned problems of the current technology are overcome by the present invention wherein a magnetic memory storage device with at least one magnetic storage element has electrical addressing leads to inject electrical current directly through a single magnetic memory storage element. The electrical addressing leads are used to inject electrical current through any individual GMR element (bit) of appropriate strength and polarity to set the Bit into either a clockwise or counter-clockwise magnetic state. The electrical addressing leads can also be used to interrogate an individual bit by cycling the injected electrical current through a known reversal of polarity and sensing the change in resistance on part of the cycle. From this, the original magnetic state of the element and, hence, the information stored, can be deduced.

The present invention has several advantages over existing technology. The addressing architecture of the present invention permits large tolerances in the alignment of the electrical addressing leads, allows the leads to be of large diameter to reduce current density, and may be directly connected, either from above and/or below, to the supporting electrical control and analysis circuitry located in the substrate below or in an overlayer. This permits the sense lines to be closely packed. This addressing scheme also avoids previous problems from "half-select" addressing, which utilizes two simultaneous signals applied to each element and demands very uniform switching response for all of the elements. The present invention uses very few leads, is easy to manufacture, and has efficient electrical power usage.

BRIEF DESCRIPTION OF THE DRAWINGS

These and other objects, features, and advantages of the invention, as well as the invention itself, will become better understood by reference to the following detailed description, appended claims, and accompanying drawings where:

FIG. 1 shows a four-bit series resistance line;

FIG. 2 shows a four-bit series resistance with addressing lines $A_1$, $A_2$, $A_3$, $A_4$, and $A_5$.

DETAILED DESCRIPTION OF THE PREFERRED EMBODIMENTS

Figure 3:
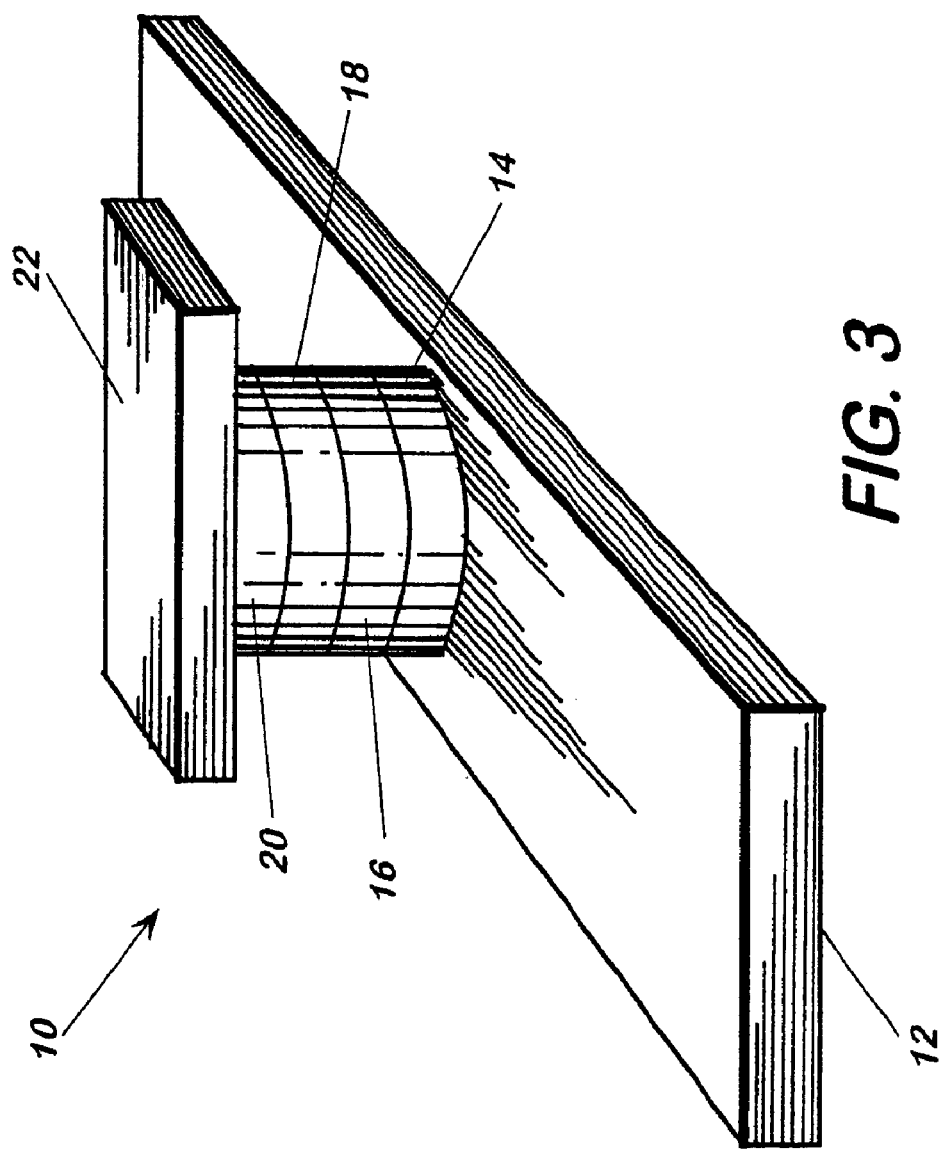
FIG. 3 shows a random access memory element with vertically stacked layers.

A preferred embodiment of the present invention is shown in FIG. 2. The memory device includes magnetic elements 40, non-magnetic metal connectors 50, and electrical addressing leads 60. In a preferred embodiment, the magnetic elements are magnetic memory storage elements 40 with a closed magnetization configuration (e.g., circular, ovular, square, triangular, rectangular, etc.). The magnetic memory storage element 40 includes vertically stacked layers. FIG. 3 shows one simple example of a vertically stacked structure. Memory element 10 in FIG. 3 includes a bottom conducting lead 12. The upper surface of bottom conducting lead 12 supports and physically contacts the lower surface of layer 14 of non-magnetic, metallic material, for example, Cu. The upper surface of nonmagnetic, conducting layer 14 supports and physically contacts layer 16 of ferromagnetic metal. The terms "upper" and "lower" are used as terms of convenience to distinguish various surfaces relative to each other, and do not imply the orientation of any element with respect to the gravitational field. The lower surface of layer 16 of ferromagnetic metal, for example, Co, rests on and physically contacts the upper surface of the non-magnetic, conducting layer 14. The lower surface of non-magnetic layer 18 rests on and physically contacts the upper surface of ferromagnetic layer 16. The upper surface of non-magnetic layer 18 supports and physically contacts the ferromagnetic layer 20. The bottom surface of top conducting lead 22 rests upon and physically contacts the upper surface of ferromagnetic layer 20.

As shown in FIGS. 1 and 2, the non-magnetic metal connectors 50 contact the upper and lower surfaces of the magnetic memory storage elements 40. Fabrication can be via vacuum deposition, electroplating, or any other suitable technique. The non-magnetic metal connectors 50 alternate contact between the upper and lower surfaces of adjacent magnetic memory storage elements 40 so that there is a continuous sense line. For example, as shown in FIG. 2, the lower surface of magnetic memory storage element #1 rests on and physically contacts the upper surface of a non-magnetic metal connector. A second non-magnetic metal connector rests on and physically contacts both magnetic storage elements #1 and #2. Magnetic memory storage elements #2 and #3 rest on and physically contact a third non-magnetic metal connector. A fourth non-magnetic metal connector rests on and physically contacts both magnetic memory storage element elements #3 and #4. Finally, magnetic memory storage element #4 rests on and physically contacts a fifth non-magnetic metal connector. Thus, there is a continuous sense line from point $S_1$ to point $S_2$ in FIG. 2. There can be any number of magnetic elements; however, using this scheme, the number of non-magnetic metal connectors will be one more than the number of magnetic memory storage elements. Again, throughout this specification, the terms "upper" and "lower" are used as terms of convenience to distinguish various surfaces relative to each other, and do not imply the orientation of any element with respect to the gravitational field.

An electrical addressing lead 60 is connected directly to each non-magnetic connector 50. This may be accomplished as the non-magnetic metal connectors 50 are fabricated or by previous and/or subsequent fabrication steps. Thus, using the scheme described above, the number of electrical addressing leads 60 will be one more than the number of magnetic memory storage elements 40. The electrical addressing leads 60 can be attached at any location on the non-magnetic connector 50, and the electrical addressing leads can be oriented in any direction (e.g., above, below, sideways). The contact area of the electrical addressing leads 60 may be as large as the area presented by the non-magnetic metal connectors 50 to reduce current density. The electrical addressing leads can be connected from above, below, or both to reach the supportive electrical control and analysis circuitry located in the substrate below or in an overlayer.

Voltages generated by the current from the address lines are sensed across the terminal end points of the sense line at $S_1$ and $S_2$. Referring to FIG. 2, an address current directed through the points $A_1$ and $A_2$ will only pass through element #1. At a sufficient strength, depending upon the construction of the element, it will orient all of the layers into a parallel magnetic configuration. It can be either right-handed or left-handed according to the choice of the current direction. Similarly, Element #2 can be written using current through $A_2$ and $A_3$, etc. Reading of the elements is achieved by cycling the current direction and monitoring the change in voltage across $S_1$-$S_2$. For example, if the memory element contains hard and soft layers, as described, for example, in U.S. Pat. No. 6,391,483 to Zhu et al., the entire contents of which are incorporated herein by reference, a cyclic pulse of known change in polarity that is sufficient to reverse a soft layer, but insufficient to reverse a hard layer, will result in an observed voltage pulse across $S_1$ and $S_2$ only when the soft layer is switched from its original orientation, which was set when the bit was written, to a reversed orientation. Whether this occurs on the positive part of the cycle, or the negative part of the cycle, will reveal the original setting of the soft layer. There are many conceivable constructions of the memory bit that can exploit similar addressing protocols. This is only offered as one example of the use of the addressing architecture of the present invention.

The above description is that of a preferred embodiment of the invention. Various modifications and variations are possible in light of the above teachings. It is therefore to be understood that, within the scope of the appended claims, the invention may be practiced otherwise than as specifically described. Any reference to claim elements in the singular, e.g. using the articles "a," "an," "the," or "said" is not construed as limiting the element to the singular.

What is claimed is:

1. A method of addressing digital data, comprising the steps of:
    (a) directing an unpolarized electrical current directly by electrical contact through a first addressing line of a device wherein the device comprises a first and a second magnetic element having a closed magnetization configuration, wherein said first and second magnetic element comprises multiple layers of magnetic and non-magnetic materials; and a first electrical addressing lead to inject a first unpolarized electrical current directly by electrical contact to a first non-magnetic metal connector for writing or reading an individual element's magnetization state, a second electrical addressing lead to inject a second unpolarized electrical current directly by electrical contact to a second non-magnetic metal connector for writing or reading an individual element's magnetization state, wherein said first non-magnetic metal connector connects to said first magnetic element and wherein said second non-magnetic metal connector connects to said second magnetic element and a third non-magnetic metal connector connects to said first and said second magnetic elements and includes a third electrical addressing lead and wherein said first unpolarized electrical current is different from said second unpolarized electrical current; and
    (b) monitoring the change in voltage across a sense line containing the addressing line.

2. The method of claim 1, wherein said magnetic element is a magnetic memory storage element.

3. The method of claim 1, wherein said electrical addressing leads can be oriented in any direction about said magnetic element.

4. The method of claim 1, wherein said electrical current injection can set a magnetic layer of the magnetic element into either clockwise or counter-clockwise magnetic states.

5. A method of addressing digital data, comprising the steps of:
    (a) directing a first unpolarized electrical current directly by electrical contact through a first electrical addressing lead to a first non-magnetic metal connector for writing or reading an individual element's magnetization state;
    (b) directing a second unpolarized electrical current directly by electrical contact through a second electrical addressing lead to a second non-magnetic metal connector for writing or reading an individual element's magnetization state, wherein said first non-magnetic metal connector connects to said first magnetic element and wherein said second non-magnetic metal connector connects to said second magnetic element and a third non-magnetic metal connector connects to said first and said second magnetic elements and includes a third electrical addressing lead and wherein said first unpolarized electrical current is different from said second unpolarized electrical current; and
    (c) monitoring the change in voltage across a sense line containing the addressing line.

6. The device of claim 5, wherein said electrical addressing leads are oriented in any direction about said magnetic element.

7. The device of claim 6, wherein said electrical current injection sets a magnetic layer of the magnetic element into either clockwise or counter-clockwise magnetic states.

* * * * *